(12) United States Patent
Kim et al.

(10) Patent No.: US 8,013,593 B2
(45) Date of Patent: Sep. 6, 2011

(54) VOLTAGE MEASURING APPARATUS FOR SEMICONDUCTOR INTEGRATED CIRCUIT AND VOLTAGE MEASURING SYSTEM HAVING THE SAME

(75) Inventors: Hyung-Soo Kim, Ichon (KR); Yong-Ju Kim, Ichon (KR); Jong-Woon Kim, Ichon (KR); Hee-Woong Song, Ichon (KR); Ic-Su Oh, Ichon (KR); Tae-Jin Hwang, Ichon (KR)

(73) Assignee: Hynix Semiconductor Inc. (KR)

( * ) Notice: Subject to any disclaimer, the term of this patent is extended or adjusted under 35 U.S.C. 154(b) by 876 days.

(21) Appl. No.: 11/961,988

(22) Filed: Dec. 20, 2007

(65) Prior Publication Data
US 2008/0252353 A1 Oct. 16, 2008

(30) Foreign Application Priority Data
Apr. 13, 2007 (KR) .................. 10-2007-0036334

(51) Int. Cl.
*G01R 25/00* (2006.01)
(52) U.S. Cl. ................. 324/76.77; 324/613; 324/762.01
(58) Field of Classification Search .................. None
See application file for complete search history.

(56) References Cited

U.S. PATENT DOCUMENTS

| | | | |
|---|---|---|---|
| 7,635,986 B2 * | 12/2009 | Takemoto et al. | 324/750.14 |
| 2005/0168259 A1 | 8/2005 | Yamawaki | |
| 2007/0007970 A1 * | 1/2007 | Neuman | 324/613 |

FOREIGN PATENT DOCUMENTS

| | | |
|---|---|---|
| JP | 53-109481 | 9/1978 |
| JP | 60-177277 | 9/1985 |
| JP | 02-159815 | 6/1990 |
| JP | 03-172774 | 7/1991 |
| JP | 07260855 | 10/1995 |
| JP | 2003-273712 | 9/2003 |
| JP | 2005-348296 | 12/2005 |

* cited by examiner

*Primary Examiner* — Huy Phan
*Assistant Examiner* — Arleen M Vazquez
(74) *Attorney, Agent, or Firm* — Baker & McKenzie LLP

(57) ABSTRACT

A voltage measuring apparatus for a semiconductor integrated circuit includes a first delay unit configured to delay a reference clock in a first region, a second delay unit configured to delay the reference clock in a second region and an analysis unit configured to analyze a difference in voltage level between the regions based on the phases of associated with the delayed clock signals generated by the first and second delay units.

8 Claims, 3 Drawing Sheets

VOLTAGE MEASURING APPARATUS FOR SEMICONDUCTOR INTEGRATED CIRCUIT AND VOLTAGE MEASURING SYSTEM HAVING THE SAME

CROSS-REFERENCE TO RELATED PATENT APPLICATION

This application claims the benefit under 35 U.S.C. 119(a) of Korean Patent Application No. 10-2007-0036334, filed on Apr. 13, 2007, in the Korean Intellectual Property Office, the disclosure of which is incorporated herein in its entirety by reference as if set forth in full.

BACKGROUND

1. Technical Field

The embodiments described herein relate to a voltage measuring apparatus for a semiconductor integrated circuit and a voltage measuring system having the same. In particular, the present invention relates to a voltage measuring apparatus for a semiconductor integrated circuit that can measure a change in voltage level due to noise, and a voltage measuring system having the same.

2. Related Art

Conventional semiconductor integrated circuits are becoming more integrated, meaning an even larger number of components are being squeezed into even smaller areas within the semiconductor integrated circuit. As a result, noise or cross-talk can effect various elements and lines within the chip. For example, such noise can cause the external power source voltage level supplied to individual regions of the semiconductor integrated circuit can change. Such variations in the power source voltage can cause performance issues and even device failures. Despite such adverse effect, a technology that measures the change in voltage level due to noise has not been actively developed. In part, this is because historically the adverse effect due to noise was not that significant. However, due to demands for high speed, high integration, and low power consumption of more modern semiconductor integrated circuits, the impact of such adverse effects is much more significant.

Usually, when it is necessary to measure the change in voltage level, a converter is provided to convert a power source voltage into a digital code. In order to implement such an conversion, the driving voltage of the converter needs to be higher than the level of the power source voltage to be measured. It has been suggested that the level of the power source voltage to be measured can be reduced using a level shifter. However, conventional methods to achieve the lower source voltage levels can cause signal distortion, and are therefore not very effective.

SUMMARY

A voltage measuring apparatus for a semiconductor integrated circuit that can measure a change in voltage level due to noise, and a voltage measuring system having the same is described herein.

In one aspect, a voltage measuring apparatus for a semiconductor integrated circuit includes a first delay unit configured to delay a reference clock in a first region, a second delay unit configured to delay the reference clock in a second region and an analysis unit configured to analyze a difference in voltage level between the regions based on the phases of associated with the delayed clock signals generated by the first and second delay units.

In another aspect, a voltage measuring system includes: a power supply apparatus configured to supply an external power source voltage to a semiconductor integrated circuit; a mother board on which the semiconductor integrated circuit is disposed; and the semiconductor integrated circuit configured to have a plurality of noise regions, in which external power is differently affected by noise, to delay a reference clock signal in the individual noise regions, and to discriminate a difference in phase between the delayed clock signals.

In still another aspect a method of measuring a voltage for a semiconductor integrated circuit includes delaying a reference clock signal in a first noise region and a second noise region to generate a first delayed clock signal and a second delayed clock signal; comparing the phase of the first delayed clock signal with the phase of the second delayed clock signal, individually; and converting the phase comparison result of the first delayed clock signal and the second delayed clock signal into a digital code as an analysis signal.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1A:
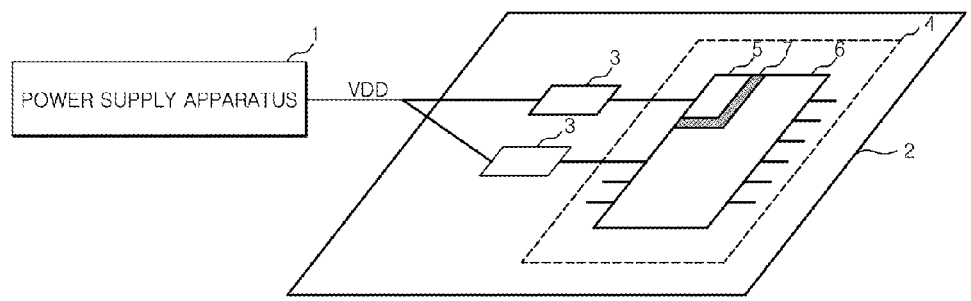
FIGS. 1A and 1B are diagrams showing example semiconductor integrated circuits with external power source.

FIG. 1 is a diagram illustrating an example voltage measuring apparatus in accordance with one embodiment. Referring to FIG. 1A, a semiconductor integrated circuit 4 is mounted on a mother board 2. The semiconductor integrated circuit 4 is supplied with an external power source voltage VDD from a power supply apparatus 1 that is disposed outside the mother board 2. One or more noise filters 3 are provided on the mother board 2 between the power supply apparatus 1 and the semiconductor integrated circuit 4. The noise filters 3 filter noise from the external power source voltage VDD.

As illustrated, the semiconductor integrated circuit 4 can be divided into a plurality of noise regions, such as a first noise region 5 and a second noise region 6. The first noise region 5 can, for example, be a region in which the external power source voltage VDD is supplied through a noise filter 3. The second noise region 6 can also be a portion of the semiconductor integrated circuit, but can exclude the first noise region 5. The second noise region 6 can also, depending on the embodiment, be supplied an external power source voltage VDD through a noise filter 3.

Figure 1B:
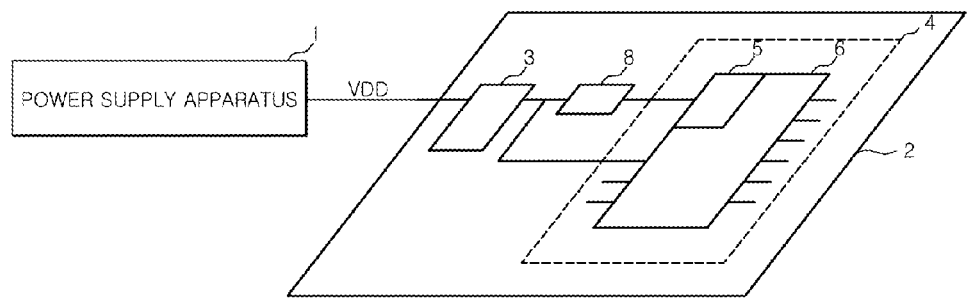

The relative size of the first and second noise regions 5 and 6, as illustrated in FIGS. 1A and 1B, is intended to convey that the number of noise generating elements in the first noise region 5 is relatively smaller than the number of noise generating elements in the second noise region 6. It will be understood, however, that the actual sizes of the first and second noise regions 5 and 6 can vary, and that the first noise region 5 can actually be physically larger than the second noise region 6, while still comprising fewer noise generation elements.

An isolation region 7 can be disposed between the first noise region 5 and the second noise region 6, so as to surround the first noise region 5 and block any noise emanating from the second noise region 6. In this manner, the power source voltage (hereinafter, referred to as "first power") being supplied to the first noise region 5 will only, or mostly only be effective by the noise generation in the first noise region 5, and vice versa. Since there are fewer noise generating elements in the first noise region 5, this means that the power source voltage supplied to the first noise region 5 should be less effected by noise than the power source voltage (hereinafter, referred to as "second power") supplied to the second noise region 6. Thus, for example, the configuration of FIGS. 1A and 1B can be advantageously implemented where a region, such as the first noise region 5, contains more sensitive circuitry than other regions of the semiconductor integrated circuit 4.

As shown in FIG. 1B, a regulator 8 can be connected between the noise filter 3 and the first noise region 5. The regulator 8 can be configured to control the level of the external power source voltage VDD that is supplied to the first noise region 5. With the regulator 8, the level of the external power source voltage VDD that is supplied to the first noise region 5 can be accurately controlled and is less sensitive to noise. This can eliminate the need to include the isolation region 7 between the first noise region 5 and the second noise region 6.

Figure 2:
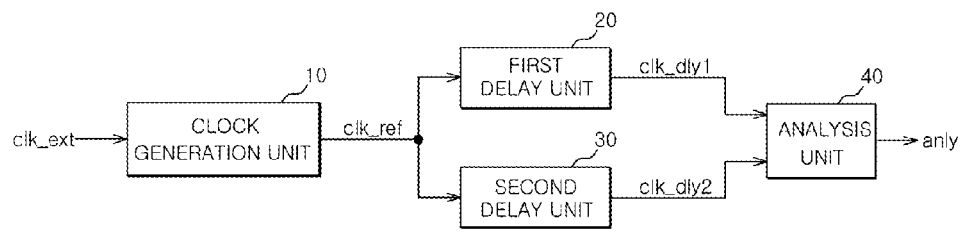
FIG. 2 is a block diagram showing the configuration of a voltage measuring apparatus for use with the semiconductor integrated circuit shown in FIGS. 1A and 1B.

FIG. 2 is a diagram illustrating a voltage measuring apparatus, according to an embodiment, for use with the semiconductor integrated circuits illustrated in FIGS. 1A and 1B. As illustrated, voltage measuring apparatus can include a clock generation unit 10, a first delay unit 20, a second delay unit 30, and an analysis unit 40. Here, the first delay unit 20 can be provided in the first noise region 5, and the second delay unit 30 can be provided in the second noise region 6. The clock generation unit 10 and the analysis unit 40 can also be disposed in the first noise region 5.

The clock generation unit 10 can be configured to generate a reference clock signal (clk_ref) from an external clock signal (clk_ext). The clock generation unit 10 can be implemented in a circuit, such as a DLL (Delay Locked Loop) circuit or a PLL (Phase Locked Loop) circuit, which generates the reference clock signal (clk_ref) having more advanced phase than the external clock signal (clk_ext) for a predetermined time.

The first delay unit 20 can be configured to delay the reference clock signal (clk_ref) in the first noise region 5 and output a first delayed clock signal (clk_dly1). The second delay unit 30 delays the reference clock signal (clk_ref) in the second noise region 6 and outputs a second delayed clock signal (clk_dly2). The analysis unit 40 can be configured to analyze a difference in voltage level between the noise regions according to a difference in phase between the first delayed clock signal (clk_dly1) and the second delayed clock signal (clk_dly2), and output an analysis signal (anly) indicative of the difference.

It should be noted that level of the first power supplied to the first noise region 5 may be fluctuating, e.g., due to noise; however, the relative change in voltage level supplied to the first and second noise regions 5 and 6 can still be determined.

If there is a relative change in voltage level between the first power and the second power, then the first delayed clock signal (clk_dly1) output from the first delay unit 20 and the second delayed clock signal (clk_dly2) output from the second delay unit 30 will have different phases. The analysis unit 40 detects the difference in phase between the first delayed clock signal (clk_dly1) and the second delayed clock signal (clk_dly2), and outputs a the analysis signal (anly), which can comprise a digitally coded message indicative of the difference.

The analysis signal (anly) can, for example, be provided to a tester. The tester can be configured to analyze the code value of the analysis signal (anly), thereby determining the amount of change in voltage level of the power source voltage supplied to the second noise region 6 with respect to the power source voltage supplied to the first noise region 5. Further, during measurement in a wafer state, a measurement point may be disposed in an arbitrary region on the semiconductor integrated circuit to enable testing in the wafer stage.

Figure 3:
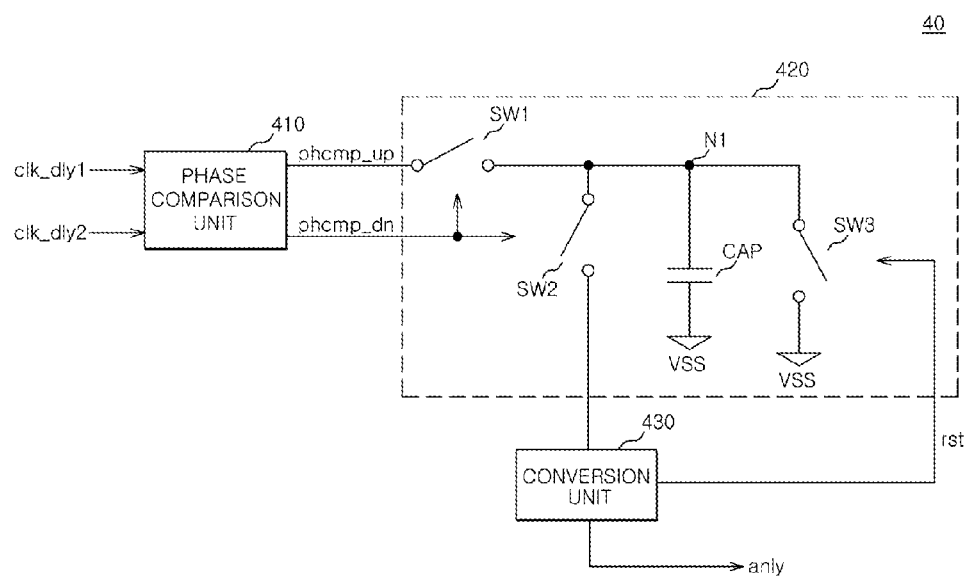
FIG. 3 is a schematic diagram showing the detailed configuration of an analysis unit included in the apparatus of FIG. 2.

FIG. 3 is a schematic diagram illustrating one example implementation of the analysis unit 40. As can be seen, the analysis unit 40 can include a phase comparison unit 410, a storage unit 420, and a conversion unit 430.

The phase comparison unit 410 compares the phase of the first delayed clock signal (clk_dly1) with the phase of the second delayed clock signal (clk_dly2), and outputs a phase comparison signal (phcmp). As the voltage difference of the first power and the second power increases, the difference in phase between the first delayed clock signal (clk_dly1) and the second delayed clock signal (clk_dly2) also increases, and the phase comparison unit 410 detects the difference in phase to generate the phase comparison signal (phcmp). In this example, the phase comparison signal (phcmp) is implemented as an up signal (phcmp_up) and a down signal (phcmp_dn) that are toggled according to the levels of the first power and the second power as indicated by the delay clock signals. The pulse width of the up signal (phcmp_up) and the down signal (phcmp_dn) can increase as the difference between the first power and the second power increases.

The storage unit 420 stores an electric charge from the phase comparison signal (phcmp) when a reset signal (rst) is disabled. The storage unit 420 includes a first switch SW1, a second switch SW2, a capacitor CAP, and a third switch SW3. The first switch SW1 is provided between an input terminal of the up signal (phcmp_up) and a first node N1, and operates under the control of the down signal (phcmp_dn). The second switch SW2 is provided between the first node N1 and the conversion unit 430, and operates under the control of the down signal (phcmp_dn). The capacitor CAP is provided between the first node N1 and a ground terminal. The third switch SW3 is provided between the first node N1 and the ground terminal, and operates under the control of the reset signal rst.

When the down signal (phcmp_dn) is disabled, the first switch SW1 is short-circuited, and the second switch SW2 is opened. Meanwhile, when the down signal (phcmp_dn) is enabled, the first switch SW1 is opened, and the second switch SW2 is short-circuited. Accordingly, if the up signal (phcmp_up) is enabled, an electric charge is stored in the capacitor CAP. If the down signal (phcmp_dn) is enabled, the electric charge stored in the capacitor CAP is transmitted to the conversion unit 430.

The conversion unit 430 converts the electric charge stored in the storage unit 420 into a digital code signal, and outputs the analysis signal (anly). If the conversion operation is completed, the conversion unit 430 enables the reset signal (rst). If the reset signal (rst) is enabled, the third switch SW3 of the storage unit 420 is short-circuited, and the electric charge stored in the capacitor CAP is reset.

Figure 4:
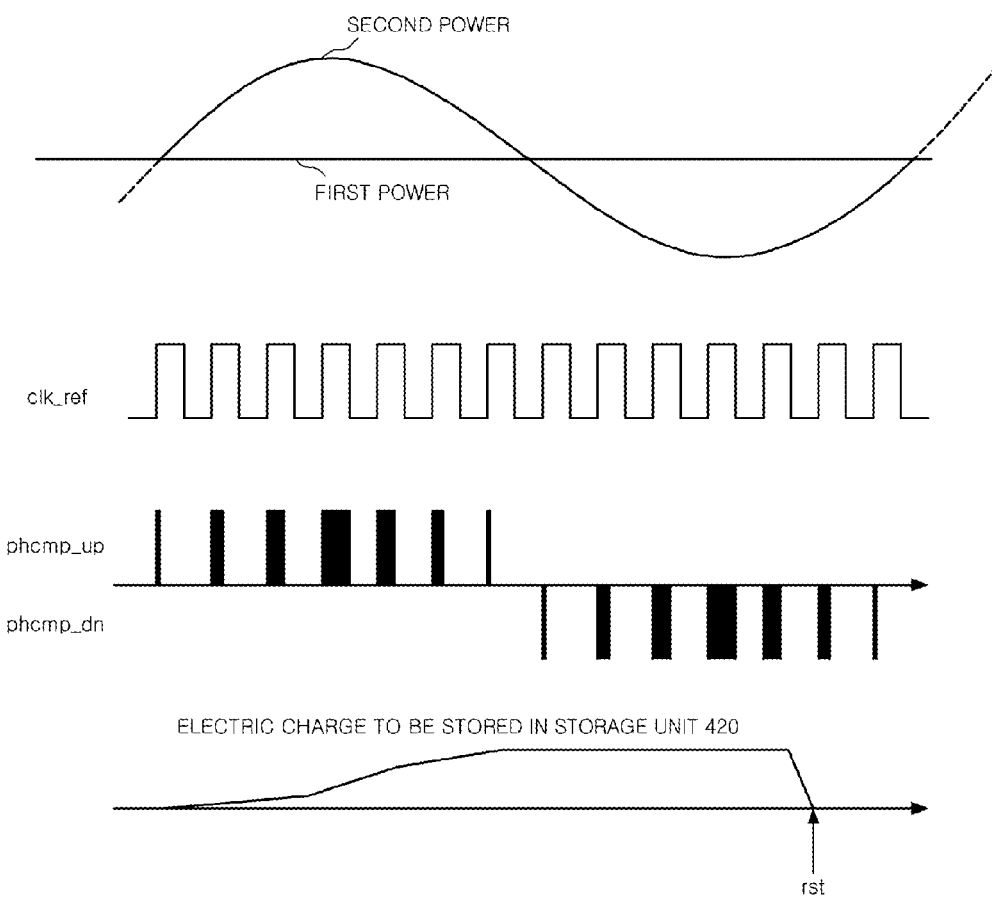
FIG. 4 is a diagram illustrating the operation of the voltage measuring apparatus shown in FIG. 2.

FIG. 4 shows the difference in voltage level between the first power and the second power, the resulting signal waveforms, i.e., the waveforms of the reference clock signal (clk_ref) and the phase comparison signal (phcmp), and the amount of electric charge to be stored in the storage unit 420.

As shown in FIG. 4, when the second power source becomes higher than the first power source, the pulse width of the up signal (phcmp_up) increases. Meanwhile, when the first power source becomes higher than the second power source, the pulse width of the down signal (phcmp_dn) increases. It can be seen that the amount of electric charge to be stored in the storage unit 420 is increased as the width of the up signal (phcmp_up) becomes large.

As described above, the voltage measuring apparatus for a semiconductor integrated circuit according to certain embodiments include a delay unit that is driven in the noise region and a delay unit that is driven in a region having minimized noise. Accordingly, the amount of change in voltage level due to noise can be measured by analyzing a difference in phase between the output clocks from the individual delay units. Therefore, it is possible to actively measure and, adjust for, a noise phenomenon that occurs due to the high speed, high integration, and low power consumption of a semiconductor integrated circuit. The voltage measuring system having the voltage measuring apparatus for a semiconductor integrated circuit as described herein can be provided in an apparatus, such as a computer or a mobile communication terminal, and used to reduce a change in power due to noise.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A voltage measuring system comprising:
    a power supply apparatus configured to supply an external power source voltage to a semiconductor integrated circuit; and
    a mother board on which the semiconductor integrated circuit is disposed,
    wherein the semiconductor integrated circuit configured to have:
        a plurality of noise regions, in which external power is differently affected by, noise;
        delay units to delay a reference clock signal in the individual noise, regions; and
        an analysis unit to discriminate a difference in phase between the delayed clock signals.

2. The voltage measuring system of claim 1, wherein the semiconductor integrated circuit has an isolation region between the noise regions.

3. The voltage measuring system of claim 1, wherein a regulator is provided at a power supply terminal of one of the plurality of noise regions in the semiconductor integrated circuit.

4. The voltage measuring system of claim 1, wherein the analysis unit outputs the difference as a digital code signal.

5. The voltage measuring system of claim 4, wherein the analysis unit comprises a phase comparison unit configured to compare the phase of the delayed clock signals with respect to each other, and outputs a phase comparison signal indicative of the difference in power source voltage levels.

6. The voltage measuring system of claim 5, wherein the analysis unit further comprises:
    a storage unit configured to store an electric charge associated with the phase comparison signal, when a reset signal is disabled; and
    a conversion unit configured to convert the electric charge stored in the storage unit into a digital code signal.

7. The voltage measuring system of claim 1, wherein the semiconductor integrated circuit further comprises a clock generation unit configured to generate the reference clock signal from an external clock signal.

8. The voltage measuring system of claim 7, wherein the clock generation unit is a DLL (Delayed Locked Loop) circuit or a PLL (Phase Locked Loop) circuit.

* * * * *